United States Patent
Chen et al.

(10) Patent No.: US 10,743,657 B2
(45) Date of Patent: Aug. 18, 2020

(54) BRACKET DEVICE FOR RACK SYSTEM AND SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chiang-Hsueh Fang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 36 days.

(21) Appl. No.: 16/137,828

(22) Filed: Sep. 21, 2018

(65) Prior Publication Data

US 2019/0365097 A1    Dec. 5, 2019

(30) Foreign Application Priority Data

May 30, 2018   (TW) .............................. 107118838 A (51) Int. Cl.
*A47B 88/407*   (2017.01)
*A47B 88/43*   (2017.01)
*H05K 7/18*   (2006.01)

(52) U.S. Cl.
CPC ............ *A47B 88/407* (2017.01); *A47B 88/43* (2017.01); *H05K 7/183* (2013.01)

(58) Field of Classification Search
CPC ...... H05K 7/183; H05K 7/1489; A47B 96/07; A47B 2088/4235; A47B 88/407; A47B 88/43
See application file for complete search history.

(56) References Cited

U.S. PATENT DOCUMENTS

| | | | |
|---|---|---|---|
| 7,357,362 B2 * | 4/2008 | Yang | H05K 7/1489 248/220.22 |
| 8,353,494 B2 * | 1/2013 | Peng | A47B 88/43 211/192 |
| 8,371,454 B2 | 2/2013 | Chen et al. | |
| 9,237,808 B2 * | 1/2016 | Chen | A47B 96/07 |
| 9,370,120 B2 | 6/2016 | Chen et al. | |
| 9,480,183 B2 | 10/2016 | Chen et al. | |
| 10,051,759 B1 * | 8/2018 | Chen | A47B 57/545 |
| 10,123,452 B2 * | 11/2018 | Chen | A47B 88/43 |
| 10,149,538 B2 * | 12/2018 | Chen | A47B 88/43 |
| 10,251,482 B2 * | 4/2019 | Chen | A47B 57/487 |
| 10,278,498 B2 | 5/2019 | Chen et al. | |
| 10,292,493 B2 * | 5/2019 | Chen | A47B 96/07 |
| 10,390,617 B2 * | 8/2019 | Chen | H05K 7/1489 |

(Continued)

*Primary Examiner* — Patrick D Hawn
(74) *Attorney, Agent, or Firm* — Alan D. Kamrath; Karin L. Williams; Mayer & Williams PC (57) ABSTRACT

A bracket device for a rack system includes a side wall, a mounting member and a fastening member. The mounting member is arranged adjacent to the side wall. The mounting member has a first vertex. The fastening member is moveable relative to the side wall. The fastening member includes a supporting part having a second vertex. When the fastening member is located at a locking position, the second vertex of the supporting part and the first vertex of the mounting member are substantially located at a same longitudinal position along a longitudinal direction.

11 Claims, 9 Drawing Sheets

(56) References Cited

U.S. PATENT DOCUMENTS

| | | | | |
|---|---|---|---|---|
| 2004/0104184 A1* | 6/2004 | Hartman | ............... | G06F 1/183 |
| | | | | 211/26 |
| 2005/0285492 A1* | 12/2005 | Hu | ............... | A47B 88/43 |
| | | | | 312/334.4 |
| 2010/0072153 A1* | 3/2010 | Chen | ............... | H05K 7/1421 |
| | | | | 211/183 |
| 2011/0290746 A1* | 12/2011 | Lu | ............... | H05K 7/1489 |
| | | | | 211/26 |
| 2015/0201754 A1 | 7/2015 | Chen et al. | | |
| 2015/0335156 A1* | 11/2015 | Chen | ............... | A47B 96/07 |
| | | | | 248/219.1 |
| 2016/0097229 A1* | 4/2016 | Chen | ............... | H05K 7/1489 |
| | | | | 16/94 R |
| 2018/0084908 A1* | 3/2018 | Chen | ............... | H05K 7/1489 |
| 2018/0271275 A1 | 9/2018 | Chen et al. | | |

* cited by examiner

BRACKET DEVICE FOR RACK SYSTEM AND SLIDE RAIL ASSEMBLY

BACKGROUND OF THE INVENTION

1. Field of the Invention

The present invention relates to a bracket device, and more particularly, to a bracket device applicable to a rack system or a slide rail assembly.

2. Description of the Prior Art

Figure 1:
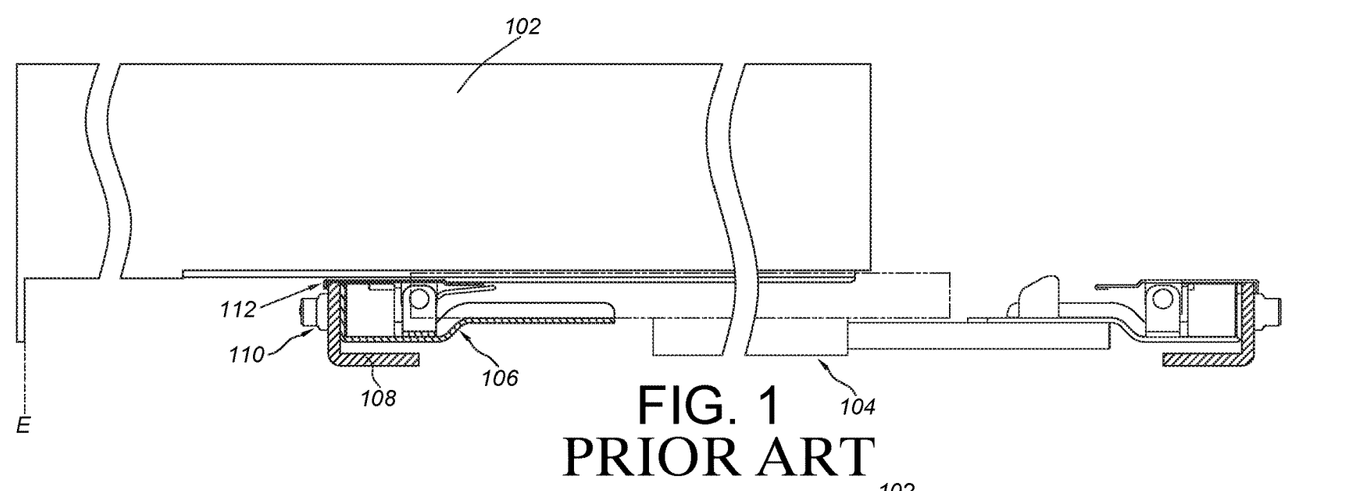
FIG. 1 is a diagram, showing a rack system, of the prior art with a carried object being located at an extension position relative to a rack through a slide rail assembly.
Figure 2:
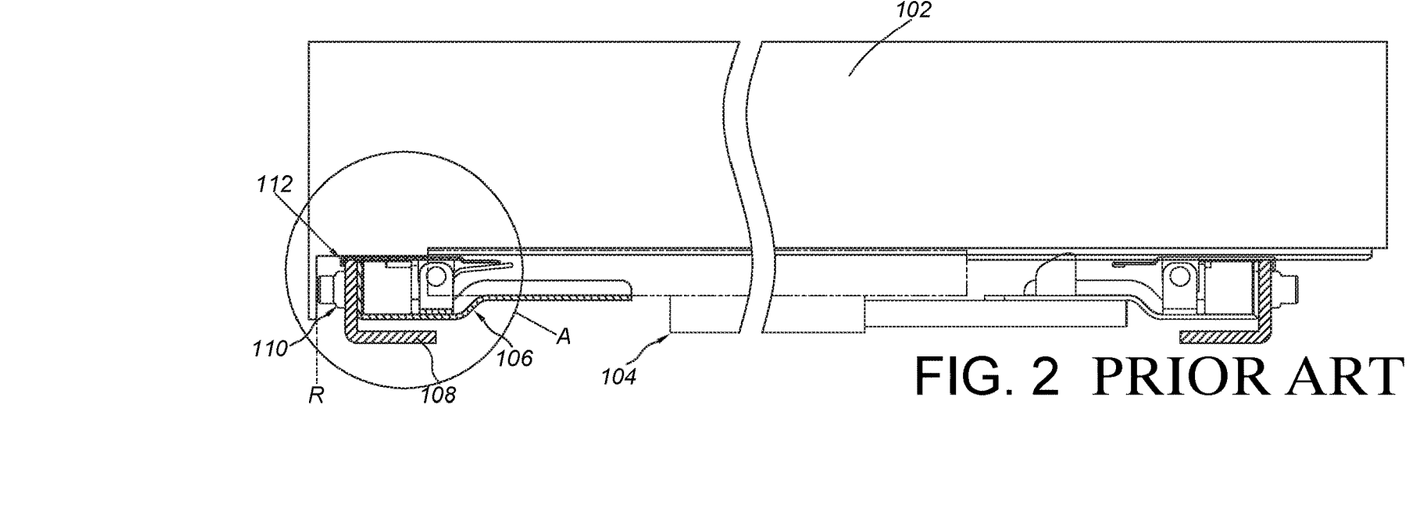
FIG. 2 is a diagram showing the carried object being located at a retracted position relative to the rack through the slide rail assembly of the prior art.

As shown in FIG. 1 and FIG. 2, in a rack system, a carried object 102 (such as an electric device, a chassis or a drawer) can be mounted to a rack (such as a post 108 of the rack) through a bracket device 106 of a slide rail assembly 104. Specifically, the carried object 102 can be pulled out of the rack to be located at an extension position E through the slide rail assembly 104; or, the carried object 102 can be pushed into the rack from the extension position E to be located at a retracted position R.

Figure 3:
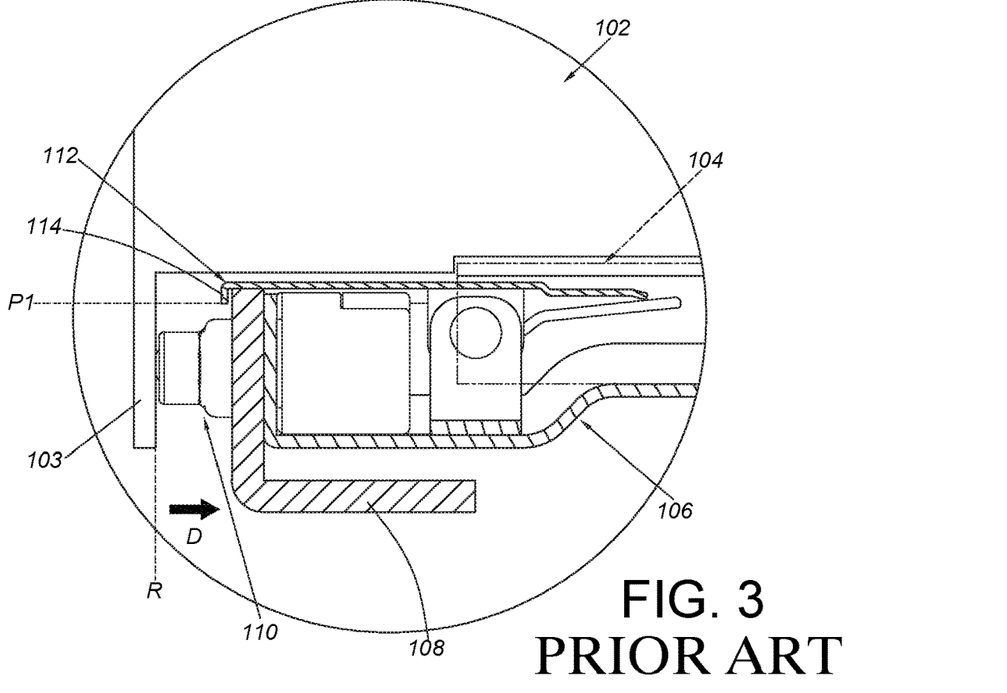
FIG. 3 is an enlarged view of an area A of FIG. 2.

As shown in FIG. 3, the bracket device 106 comprises a mounting member 110 and a fastening member 112. The mounting member 110 is configured to be inserted into a mounting hole of the post 108. The fastening member 112 is configured to be located at a locking position P1 or be moved away from the locking position P1. Wherein, when the fastening member 112 is located at the locking position P1, a fastening part 114 of the fastening member 112 is configured to lock the post 108. For example, the fastening part 114 of the fastening member 112 is in front of the post 108 to block the post 108. In such state, the mounting member 110 can be prevented from detaching from the mounting hole of the post 108 along a direction D (such as a backward direction).

Figure 4:
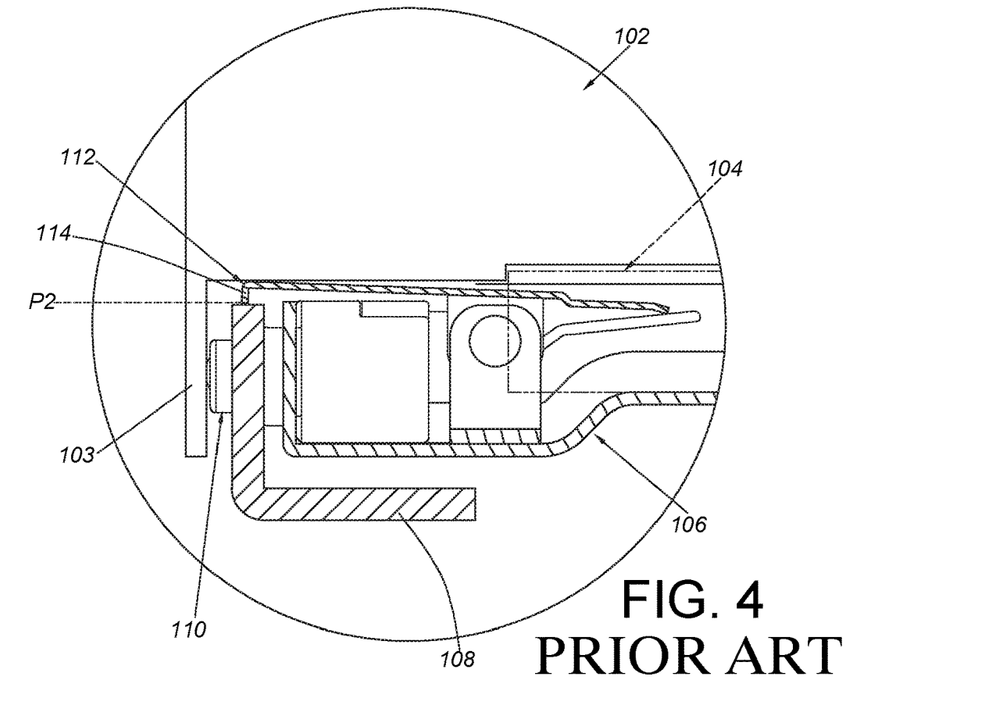
FIG. 4 is a diagram showing a fastening member of a bracket device of the prior art without locking a post of the rack.

As shown in FIG. 4, sometimes an on-site staff needs to perform shock test on the slide rail assembly 104 mounted to the post 108 of the rack through the bracket device 106. If a shock force is too large, the mounting member 110 might be slightly moved backward from the mounting hole of the post 108 along the direction D due to tolerances, such that the fastening part 114 of the fastening member 112 is driven to hit the post 108 to further cause the fastening member 112 to move away from the locking position P1 to be located at an unlocking position P2. In other words, the fastening part 114 of the fastening member 112 no longer locks the post 108. In such state, the slide rail assembly 104 might fall from the post 108 so as to cause damages on the carried object 102 or hurt people. As such, the slide rail assembly 104 has some safety concerns. On the other hand, when the carried object 102 is pushed by a strong force along the direction D to move from the extension position E to the retracted position R, an ear part 103 of the carried object 102 might strongly hit the mounting member 110. In such state, the fastening member 112 might be shocked to move away from the locking position P1 to be located at the unlocking position P2, which causes the same aforementioned problems. Therefore, it is important to develop a reliable product.

SUMMARY OF THE INVENTION

The present invention relates to a bracket device applicable to a rack system or a slide rail assembly.

According to an embodiment of the present invention, a rack system comprises a rack and a pair of slide rail assemblies. Each of the slide rail assemblies is mounted to at least one post of the rack through at least one bracket device. The pair of slide rail assemblies is configured to carry a carried object. The carried object is movable along a longitudinal direction through the pair of slide rail assemblies. The at least one bracket device comprises a side wall, a mounting member and a fastening member. The mounting member is arranged adjacent to the side wall. The mounting member has a first vertex configured to pass through the at least one post of the rack. The fastening member is movable relative to the side wall and configured to be located at a locking position or be moved away from the locking position. The fastening member comprises a supporting part. The supporting part has a second vertex. Wherein, when the fastening member is moved away from the locking position, the supporting part is away from the mounting member. Wherein, when the fastening member is located at the locking position, the supporting part is adjacent to the mounting member, and the second vertex of the supporting part and the first vertex of the mounting member are substantially located at a same longitudinal position along the longitudinal direction. Wherein, when the fastening member is located at the locking position and the carried object is located at a predetermined position, the second vertex is configured to abut against the carried object.

Preferably, the fastening member further comprises a longitudinal part and a transverse part bent relative to the longitudinal part. The supporting part is extended a first predetermined distance from the transverse part along the longitudinal direction.

Preferably, the fastening member is pivoted relative to the side wall, and the fastening member is configured to be held at the locking position in response to an elastic force of an elastic member.

Preferably, each of the slide rail assemblies comprises a first rail and a second rail movable relative to the first rail. The first rail is mounted to the at least one post of the rack through the at least one bracket. The second rail is configured to carry the carried object. When the carried object is located at the predetermined position relative to the first rail through the second rail, the second rail is adjacent to a lateral side of the longitudinal part of the fastening member for preventing the fastening member from being moved away from the locking position.

Preferably, when the fastening member is located at the locking position, the transverse part of the fastening member is adjacent to a surface of the at least one post.

Preferably, the fastening member further comprises an extension wall extended a second predetermined distance from the transverse part, along the longitudinal direction. The second predetermined distance is smaller than the first predetermined distance. The extension wall is connected to the supporting part.

Preferably, the at least one bracket device further comprises an end wall substantially perpendicularly connected to the side wall. The mounting member is arranged on the end wall.

According to another embodiment of the present invention, a slide rail assembly comprises a first rail, a second rail and at least one bracket device. The second rail is movable relative to the first rail along a longitudinal direction. The at least one bracket device is configured to mount the first rail to a rack. The at least one bracket device comprises a side wall, a mounting member and a fastening member. The mounting member is arranged adjacent to the side wall. The mounting member is configured to penetrate through a post of the rack. The mounting member has a first vertex exceeding one side of the post. The fastening member is movable relative to the side wall and configured to be located at a locking position. The fastening member comprises a supporting part. The supporting part has a second vertex. Wherein, when the fastening member is moved away from the locking position, the supporting part is away from the mounting member. Wherein, when the fastening member is located at the locking position, the supporting part is adjacent to the mounting member, and the second vertex of the supporting part and the first vertex of the mounting member are substantially located at a same longitudinal position along the longitudinal direction.

According to another embodiment of the present invention, a bracket device comprises a side wall, a mounting member and a fastening member. The mounting member is arranged adjacent to the side wall. The mounting member has a first vertex. The fastening member is movable relative to the side wall and configured to be located at a locking position. The fastening member comprises a supporting part. The supporting part has a second vertex. Wherein, the second vertex of the supporting part and the first vertex of the mounting member are configured to be substantially located at a same longitudinal position along a longitudinal direction.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
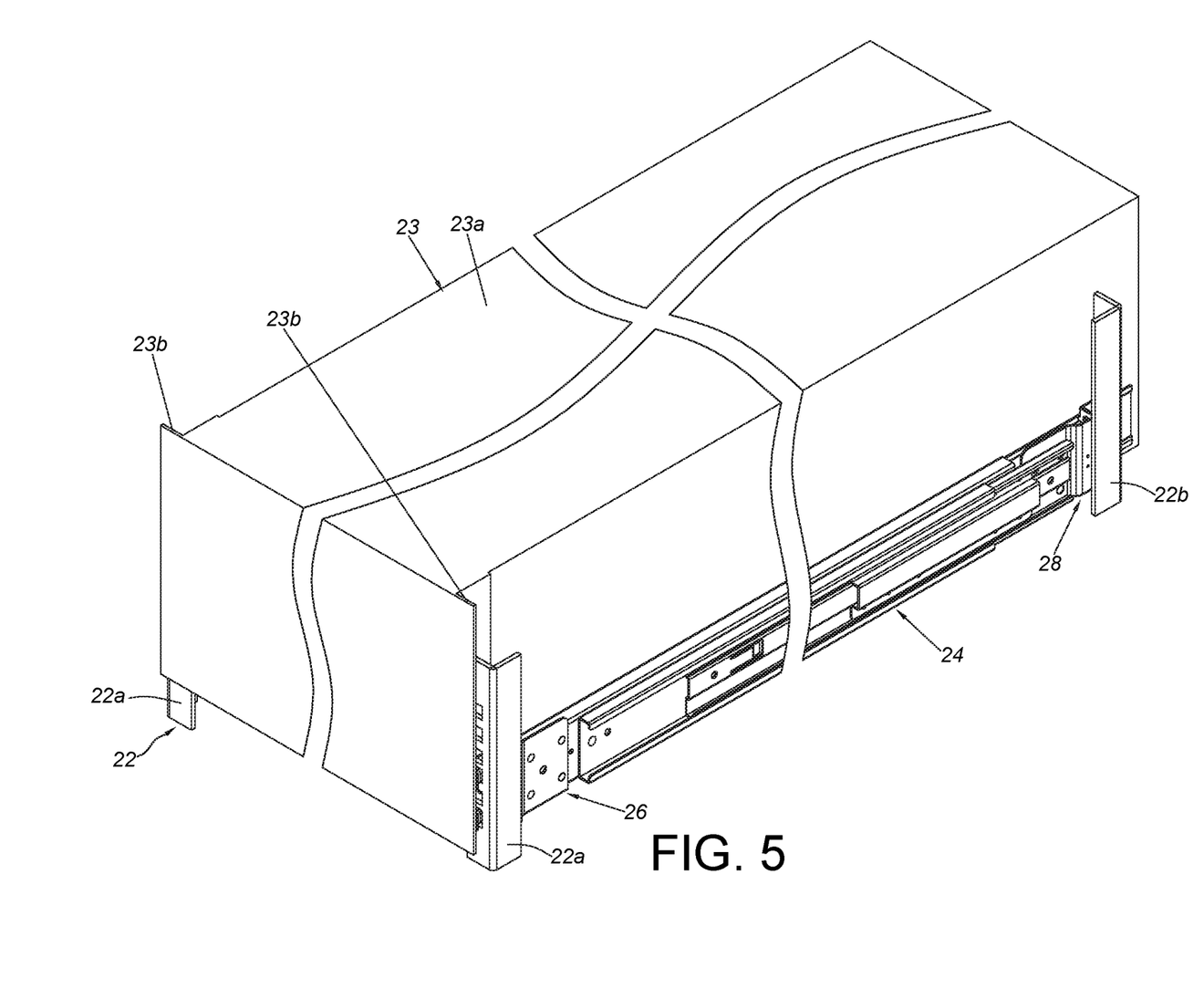
FIG. 5 is a diagram, showing a rack system according to a first embodiment of the present invention.

As shown in FIG. 5, a rack system comprises a rack 22 and a pair of slide rail assemblies (only one slide rail assembly 24 is shown in the figure due to viewing angle).

The rack 22 comprises a plurality of posts, such as a pair of first posts 22a and a pair of second posts 22b (one of the second posts 22b is not shown in the figure due to viewing angle). Specifically, each of two opposite sides of the rack 22 is arranged with a first post 22a and a second post 22b. In the present embodiment, the first post 22a is a front post, and the second post 22b is a rear post. But the present invention is not limited thereto.

The pair of slide rail assemblies 24 is respectively arranged at the two opposite sides of the rack 22, and the pair of slide rail assemblies 24 is configured to carry a carried object 23. Wherein, the carried object 23 comprises a body part 23a and an ear part 23b. The ear part 23b is arranged adjacent to a front end of the body part 23a. The slide rail assembly 24 has at least one bracket device configured to be mounted to at least one post of the rack 22. For example, the slide rail assembly 24 can be correspondingly mounted to the first post 22a and the second post 22b through a first bracket device 26 and a second bracket device 28.

Figure 6:
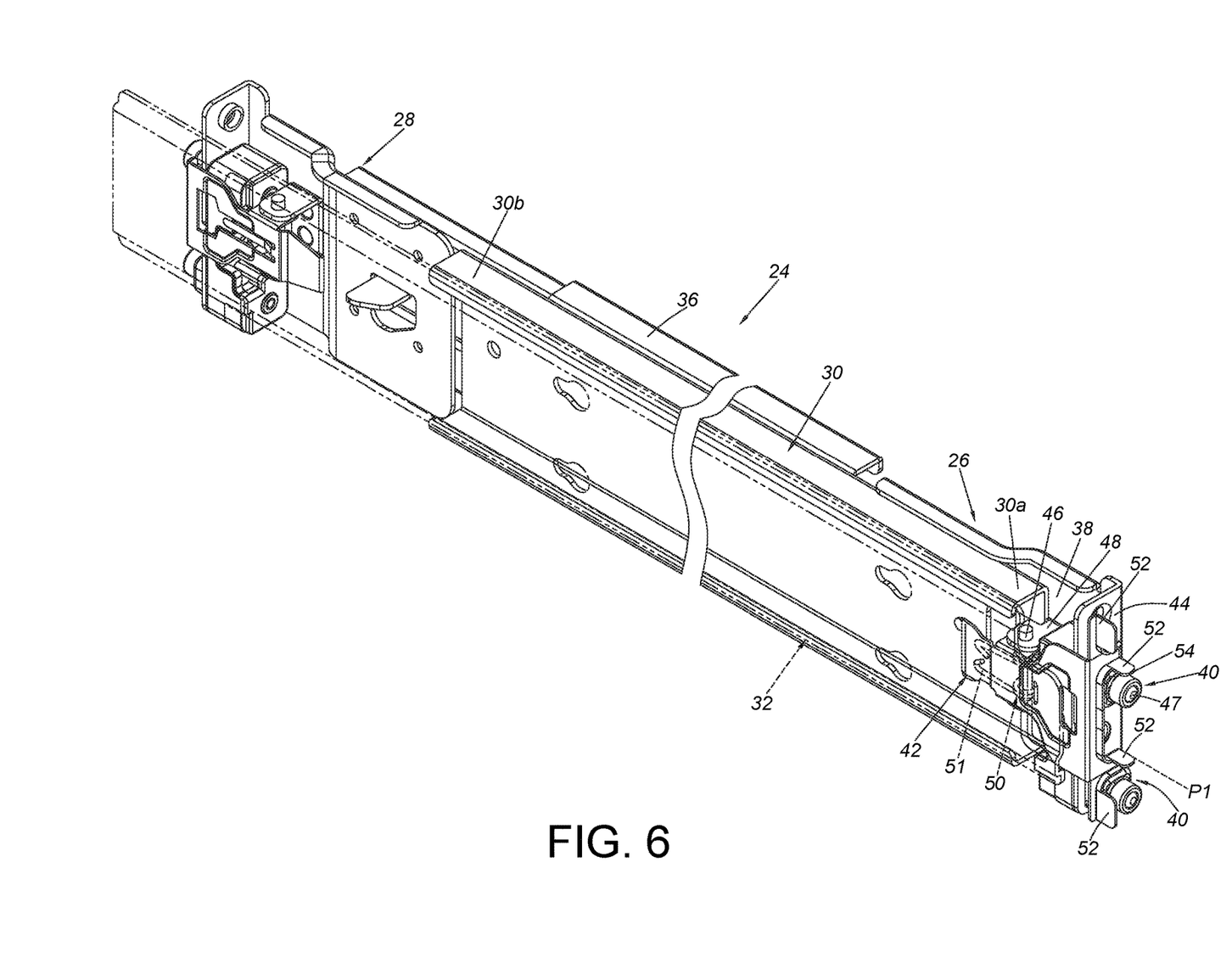
FIG. 6 is a diagram showing a slide rail assembly according to the first embodiment of the present invention.
Figure 7:
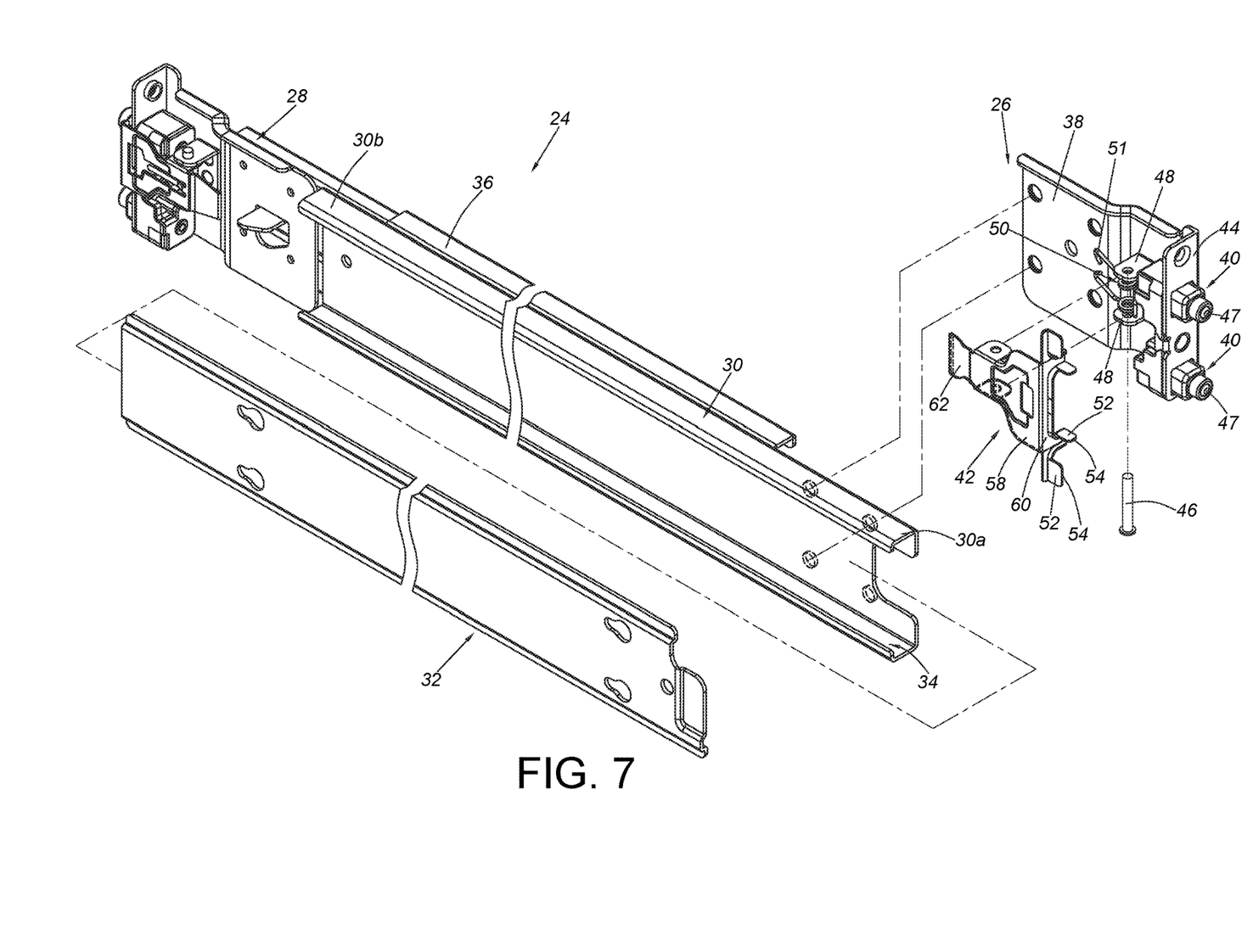
FIG. 7 is an exploded view of the slide rail assembly according to the first embodiment of the present invention.

As shown in FIG. 6 and FIG. 7, the slide rail assembly 24 comprises a first rail 30 and a second rail 32 movable relative to the first rail 30 along a longitudinal direction. In the present embodiment, the first rail 30 has a plurality of walls defining a passage 34. The passage 34 is configured to movably mount the second rail 32, but the present invention is not limited thereto. The first rail 30 has a first end part 30a and a second end part 30b, such as a front end part and a rear end part. The second rail 32 is configured to carry the carried object 23. Furthermore, the first rail 30 is configured to be mounted to the first post 22a and the second post 22b of the rack 22 through the first bracket device 26 and the second bracket device 28.

The second bracket device 28 is adjustable relative to the first rail 30 of the slide rail assembly 24. For example, a reinforcing member 36 is arranged at a back side of the first rail 30. The second bracket device 28 is movably connected to the reinforcing member 36, and the second bracket device 28 can be moved to a position adjacent to the second end part 30b of the first rail 30.

The first bracket device 26 is arranged adjacent to the first end part 30a of the first rail 30. In the present embodiment, the first bracket device 26 is connected to the first rail 30 and adjacent to the first end part 30a of the first rail 30. The first bracket device 26 comprises a side wall 38, at least one mounting member 40 and a fastening member 42. Preferably, the first bracket device 26 further comprises an end wall 44 substantially perpendicularly bent relative to the side wall 38. In the present embodiment, the end wall 44 is substantially perpendicularly connected to the side wall 38.

In the present embodiment, the first bracket device 26 comprises two mounting members 40. Each of the mounting members 40 is arranged adjacent to the side wall 38. In the present embodiment, the mounting member 40 is arranged on the end wall 44. The fastening member 42 is movable relative to the side wall 38. For example, the fastening member 42 is pivoted relative to the side wall 38. Furthermore, the fastening member 42 is pivoted to a pair of lugs 48 of the side wall 38 through a shaft member 46, and an elastic member 50 is provided with an elastic part 51 configured to provide an elastic force to the fastening member 42. The fastening member 42 is configured to be held at a locking position P1 in response to the elastic force of the elastic member 50. Moreover, the mounting member 40 has a first vertex 47, and the fastening member 42 comprises at least one supporting part 52. In the present embodiment, the fastening member 42 comprises four supporting parts 52, but the present invention is not limited thereto. Each of the supporting parts 52 has a second vertex 54.

Figure 8:
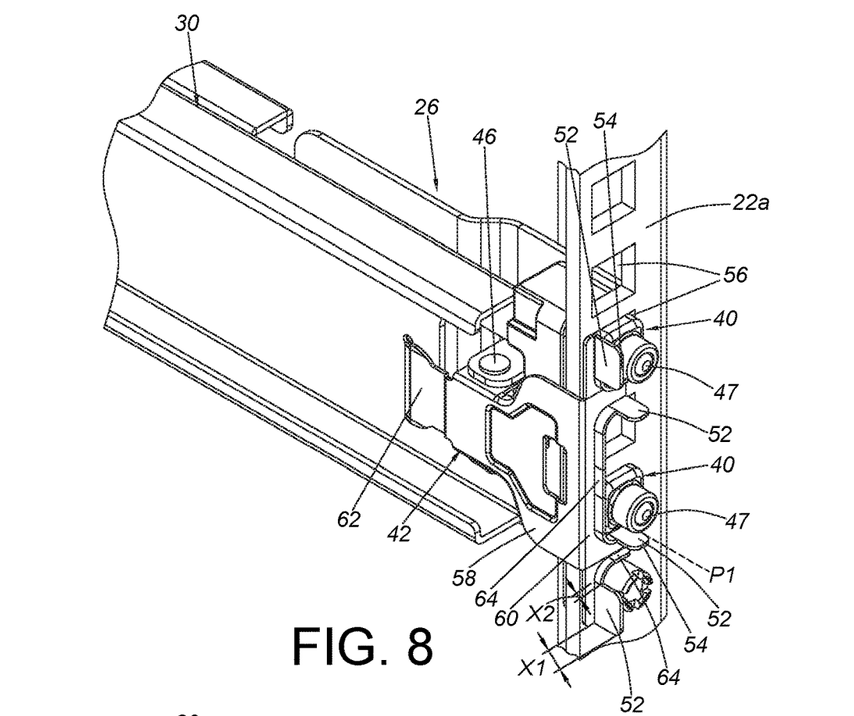
FIG. 8 is a diagram showing a first rail of the slide rail assembly being mounted to a rack through a bracket device with a fastening member being located at a position according to the first embodiment of the present invention.

As shown in FIG. 8, the first post 22a has a plurality of mounting holes 56. On the other hand, the first rail 30 is configured to be mounted to the first post 22a of the rack 22 through the first bracket device 26. Furthermore, the first vertex 47 of the mounting member 40 of the first bracket device 26 exceeds one side of the first post 22a of the rack 22. For example, the mounting member 40 of the first bracket device 26 penetrates through the mounting hole 56 of the first post 22a, such that the first vertex 47 of the mounting member 40 is moved from a rear side of the first post 22a to a front side of the first post 22a. Wherein, when the fastening member 42 of the first bracket device 26 is located at the locking position P1, the supporting part 52 is adjacent to the mounting member 40, and the second vertex 54 of the supporting part and the first vertex 47 of the mounting member 40 are substantially located at a same longitudinal position along the longitudinal direction. In a first embodiment of the present invention, the second vertex 54 of the supporting part 52 and the first vertex 47 of the mounting member 40 are actually located at the same longitudinal position along the longitudinal direction. Preferably, the fastening member 42 further comprises a longitudinal part 58, a transverse part 60 and an operating part 62. The longitudinal part 58 is connected between the transverse part 60 and the operating part 62. The transverse part 60 is bent relative to the longitudinal part 58. Preferably, the supporting part 52 is extended a first predetermined distance X1 from the transverse part 60 along the longitudinal direction. The fastening member 42 further comprises an extension wall 64 extended a second predetermined distance X2 from the transverse part 60 along the longitudinal direction, and the second predetermined distance X2 is smaller than the first predetermined distance X1. The extension wall 64 is connected to the supporting part 52 in order to reinforce structural strength of the supporting part 52.

Figure 9:
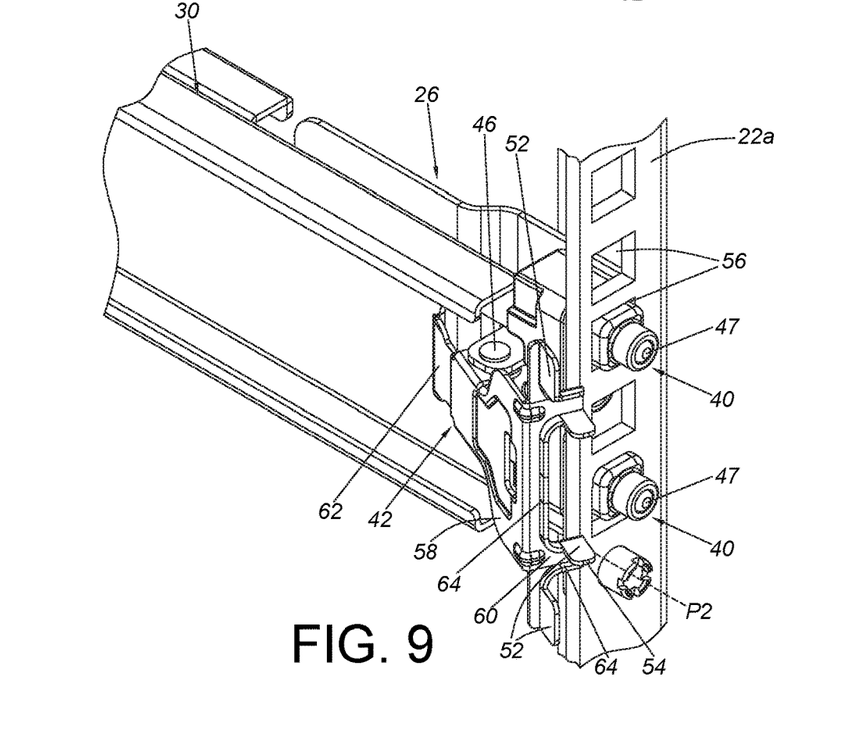
FIG. 9 is a diagram showing the first rail of the slide rail assembly being mounted to the rack through the bracket device with the fastening member being moved away from the position according to the first embodiment of the present invention.

As shown in FIG. 9, the fastening member 42 is configured to be moved away from the locking position P1 to be located at an unlocking position P2. Preferably, a user can operate the operating part 62 to move the fastening member 42 from the locking position P1 to the unlocking position P2. Wherein, when the fastening member 42 is located at the unlocking position P2, the supporting part 52 is away from the mounting member 40.

Moreover, when the fastening member 42 is located at the locking position P1, the fastening member 42 (or the transverse part 60 of the fastening member 42) is configured to lock the first post 22a (as shown in FIG. 8). When the fastening member 42 is located at the unlocking position P2, the fastening member 42 (or the transverse part 60 of the fastening member 42) no longer locks the first post 22a (as shown in FIG. 9), such that the mounting member 40 can be detached from the mounting hole 56 of the first post 22a.

Figure 10:
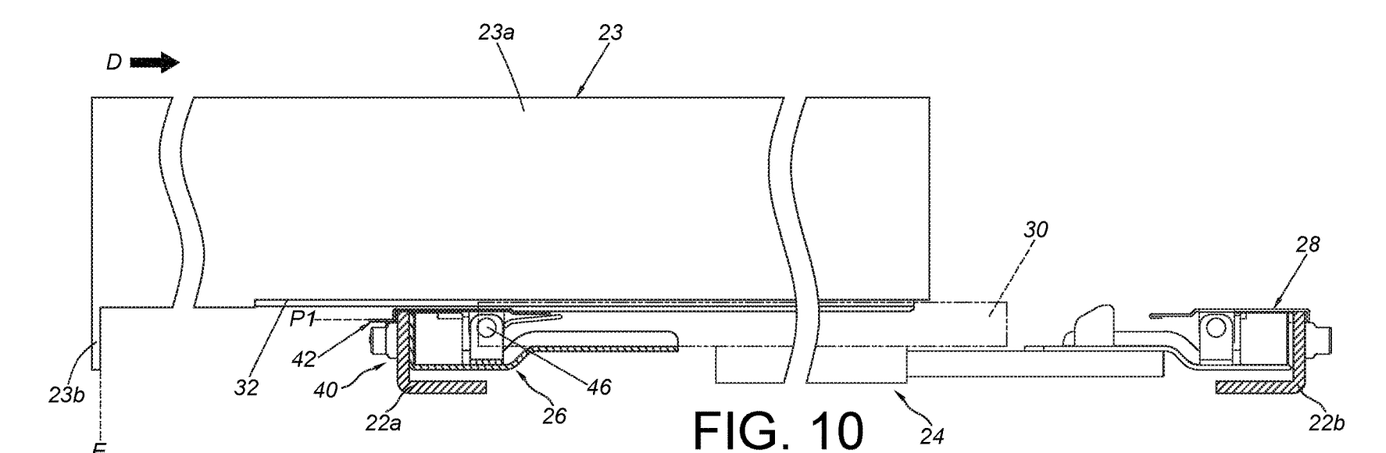
FIG. 10 is a diagram showing the rack system according to the first embodiment of the present invention with a carried object being located at an extension position relative to the rack through the slide rail assembly.
Figure 11:
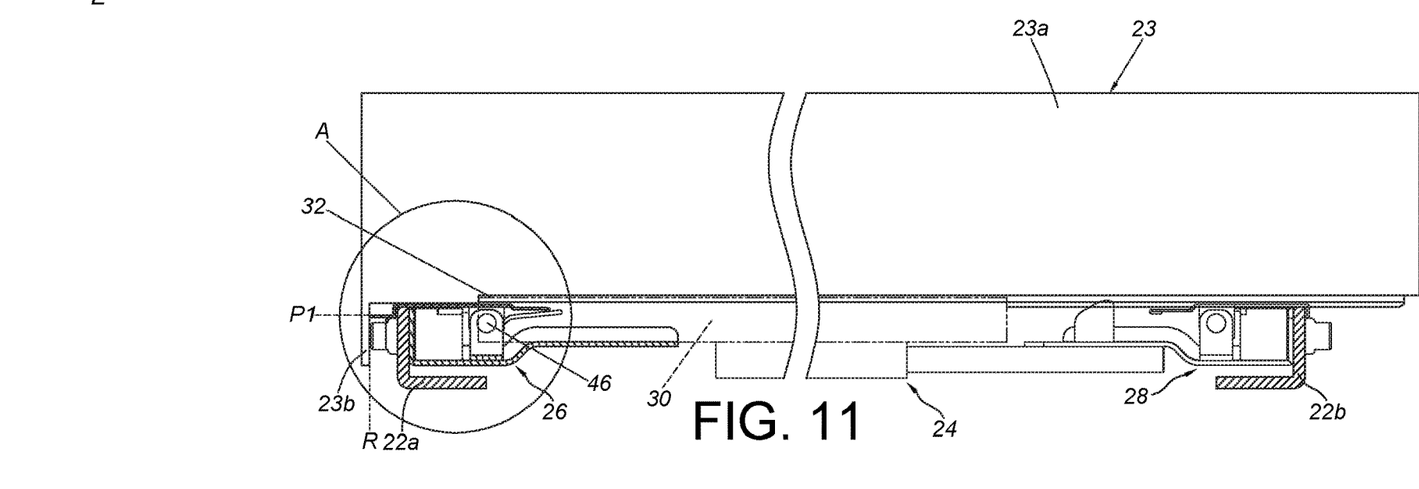
FIG. 11 is a diagram showing the rack system according to the first embodiment of the present invention with the carried object being located at a predetermined position relative to the rack through the slide rail assembly.

As shown in FIG. 10 and FIG. 11, the slide rail assembly 24 can be correspondingly mounted to the first post 22a and the second post 22b through the first bracket device 26 and the second bracket device 28. Wherein, the fastening member 42 is located at the locking position P1, and the fastening member 42 (or the transverse part 60 of the fastening member 42) is configured to lock the first post 22a (please also refer to FIG. 12). Furthermore, the carried object 23 is movable along the longitudinal direction through the slide rail assembly 24. In the present embodiment, the carried object 23 can be moved along the longitudinal direction relative to the first rail 30 through the second rail 32 from a predetermined position R to an extension position E; or, the carried object 23 can be moved from the extension position E to the predetermined position R. Wherein, the predetermined position R can be a retracted position.

Figure 12:
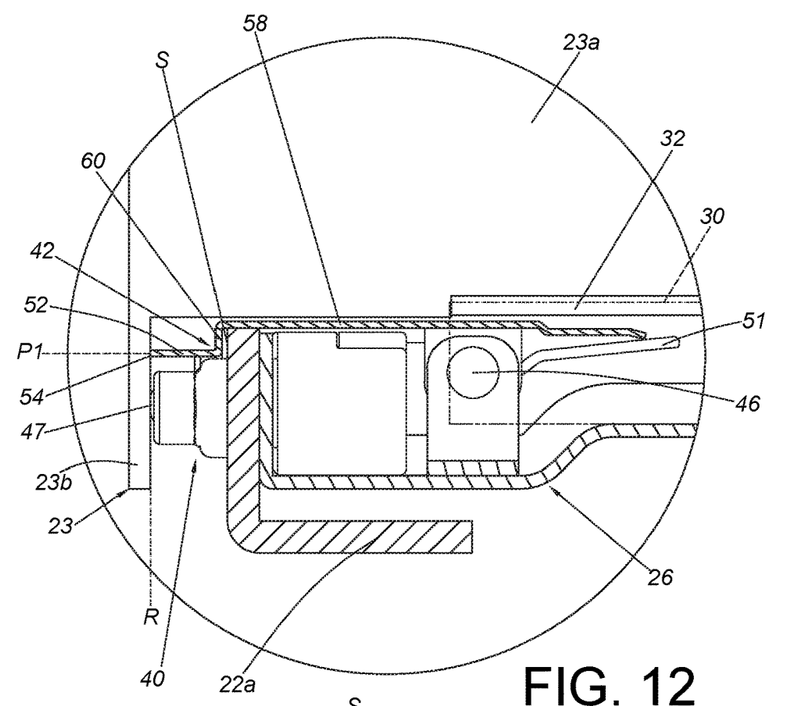
FIG. 12 is an enlarged view of an area A of FIG. 11, wherein a second vertex of a supporting part of the fastening member and a first vertex of a mounting member are located at a same longitudinal position.

As shown in FIG. 12, when the fastening member 42 is located at the locking position P1 and the carried object 23 is located at the predetermined position R, the second vertex 54 of the supporting part 52 of the fastening member 42 is configured to abut against the ear part 23b of the carried object 23. Preferably, when the fastening member 42 is located at the locking position P1, the transverse part 60 of the fastening member 42 is close to (or adjacent to) a surface S of the first post 22a.

In addition, when the carried object 23 is pushed by a strong force to move from the extension position E to the predetermined position R along a direction D, the ear part 23b of the carried object 23 might strongly hit the second vertex 54 of the supporting part 52 of the fastening member 42, or the ear part 23b of the carried object 23 might strongly hit the first vertex 47 of the mounting member 40. In such state, the slide rail assembly 24 is slightly moved backward along the direction D. Wherein, since the transverse part 60 of the fastening member 42 at the locking position P1 is close to (or adjacent to) the surface S of the first post 22a, the transverse part 60 of the fastening member 42 is configured to abut against the surface S in response to the slide rail assembly 24 slightly moving backward along the direction D, in order to prevent the fastening member 42 from moving away from the locking position P1 caused by shocks of impact. Therefore, reliability and safety of mounting the slide rail assembly 24 or the first bracket device 26 to the first post 22a of the rack 22 can be ensured.

Preferably, when the carried object 23 is located at the predetermined position R relative to the first rail 30 through the second rail 32, at least one portion (such as a front rail section) of the second rail 32 is adjacent to and corresponding to a lateral side of the longitudinal part 58 of the fastening member 42, so as to block the fastening member 42 for preventing the fastening member 42 from moving away from the locking position P1 along a rotational direction.

Figure 13:
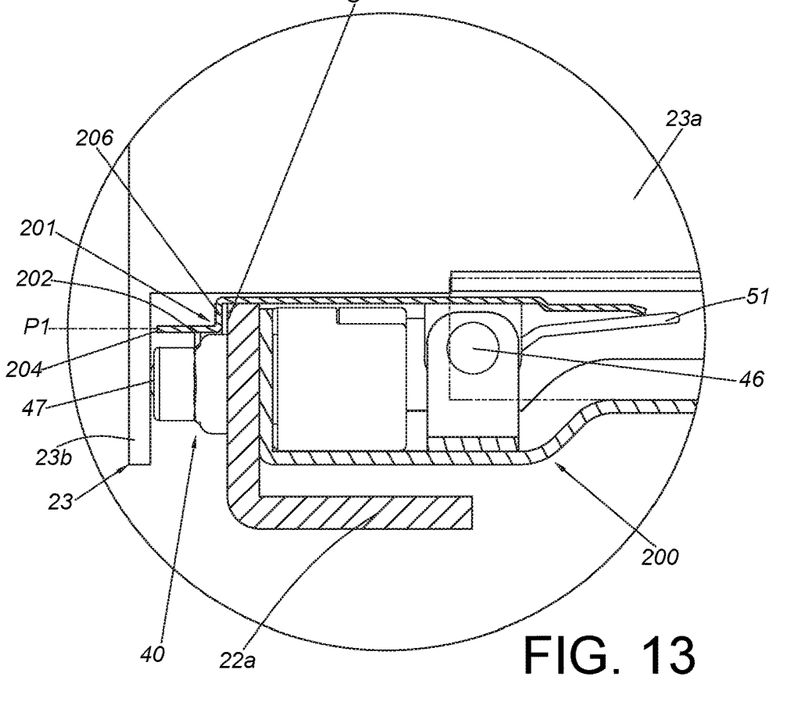
FIG. 13 is a diagram showing a rack system according to a second embodiment of the present invention, wherein a second vertex of a supporting part of a fastening member is located at a longitudinal position slightly behind a longitudinal position of the first vertex of the mounting member.

FIG. 13 is a diagram showing a first bracket device 200 according to a second embodiment of the present invention. Specifically, a second vertex 204 of a supporting part 202 and the first vertex 47 of the mounting member 40 are substantially located at the same longitudinal position along the longitudinal direction. However, in the second embodiment, the longitudinal position of the second vertex 204 of the supporting part 202 is slightly behind the longitudinal position of the first vertex 47 of the mounting member 40 due to tolerance. When a fastening member 201 is located at the locking position P1 and the carried object 23 is moved from the extension position E to the predetermined position R along the direction D to strongly hit the first vertex 47 of the mounting member 40, the slide rail assembly 24 is slightly moved backward along the direction D. Since a transverse part 206 of the fastening member 201 at the locking position P1 is adjacent to the surface S of the first post 22a, the transverse part 206 of the fastening member 201 is configured to abut against the surface S in response to the slide rail assembly 24 slightly moving backward along the direction D. Moreover, the ear part 23b of the carried object 23 might be supported by or abut against the supporting part 202 due to impact. Therefore, the fastening member 201 is prevented from moving away from the locking position P1.

Figure 14:
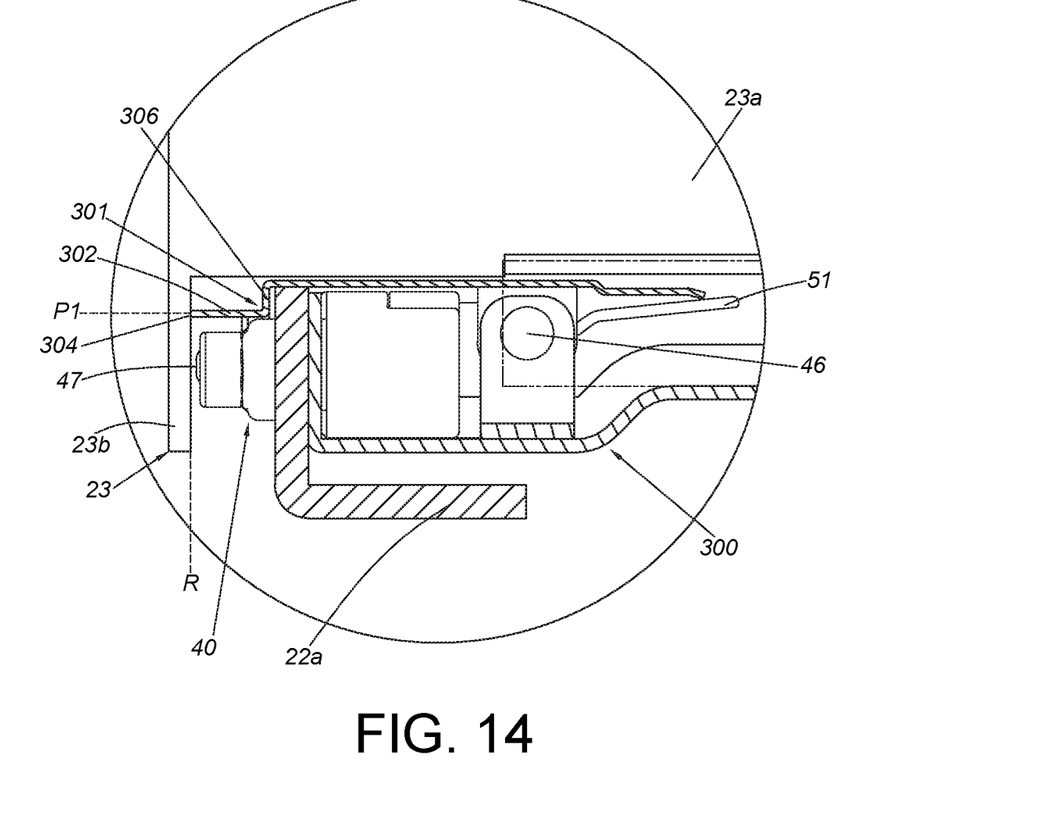
FIG. 14 is a diagram showing a rack system according to a third embodiment of the present invention, wherein a second vertex of a supporting part of a fastening member is located at a longitudinal position slightly in front of a longitudinal position of the first vertex of the mounting member.

FIG. 14 is a diagram showing a first bracket device 300 according to a third embodiment of the present invention. Specifically, a second vertex 304 of a supporting part 302 and the first vertex 47 of the mounting member 40 are substantially located at the same longitudinal position along the longitudinal direction. However, in the third embodiment, the longitudinal position of the second vertex 304 of the supporting part 302 is slightly in front of the longitudinal position of the first vertex 47 of the mounting member 40 due to tolerance. When a fastening member 301 is located at the locking position P1 and the carried object 23 is moved from the extension position E to the predetermined position R along the direction D, the ear part 23b of the carried object 23 is supported by or abuts against the second vertex 304 of the supporting part 302 of the fastening member 301. Furthermore, when the carried object 23 strongly hits the second vertex 304 of the supporting part 302 along the direction D, the fastening member 301 is prevented from moving away from the locking position P1 since a transverse part 306 of the fastening member 301 is adjacent to the surface S of the first post 22a.

Therefore, the rack system of the present invention is characterized in that:

1. When the fastening member (42, 201, 301) is located at the locking position P1, the second vertex (54, 204, 304) of the supporting part (52, 202, 302) and the first vertex 47 of the mounting member 40 are substantially located at the same longitudinal position along the longitudinal direction. The second vertex (54, 204, 304) is configured to abut against or support the ear part 23b of the carried object 23.

2. Since the transverse part (60, 206, 306) of the fastening member (42, 201, 301) is adjacent to the surface S of the first post 22a, the transverse part (60, 206, 306) of the fastening member (42, 201, 301) is configured to abut against the surface S in response to an external force or an impact force, in order to prevent the fastening member (42, 201, 301) from moving away from the locking position P1 due to shocks of impact, such that the fastening member (42, 201, 301) cannot be freely moved away from the locking position P1 to the unlocking position P2 by the external force. Therefore, reliability and safety of mounting the slide rail assembly 24 or the first bracket device (26, 200, 300) to the first post 22a of the rack 22 can be ensured.

3. When the carried object 23 is located at the predetermined position R relative to the first rail 30 through the second rail 32, at least one portion of the second rail 32 is adjacent to the lateral side of the longitudinal part 58 of the fastening member (42, 201, 301), so as to prevent the fastening member (42, 201, 301) from moving away from the locking position P1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rack system, comprising:
   a rack; and
   a pair of slide rail assemblies, each of the slide rail assemblies being mounted to at least one post of the rack through at least one bracket device, the pair of slide rail assemblies being configured to carry a carried object, the carried object being movable along a longitudinal direction through the pair of slide rail assemblies, the at least one bracket device comprising:
      a side wall;
      a mounting member arranged adjacent to the side wall, the mounting member having a first vertex configured to pass through the at least one post of the rack; and
      a fastening member movable relative to the side wall and configured to be located at a locking position or be moved away from the locking position, the fastening member comprising a supporting part, the supporting part having a second vertex;
   wherein when the fastening member is moved away from the locking position, the supporting part is away from the mounting member;
   wherein when the fastening member is located at the locking position, the supporting part is adjacent to the mounting member, and the second vertex of the supporting part and the first vertex of the mounting member are substantially located at a same longitudinal position along the longitudinal direction;
   wherein when the fastening member is located at the locking position and the carried object is located at a predetermined position, the second vertex is configured to abut against the carried object;
   wherein the fastening member further comprises a longitudinal part and a transverse part bent relative to the longitudinal part, the supporting part is extended a first predetermined distance from the transverse part along the longitudinal direction;
   wherein the fastening member further comprises an extension wall extended a second predetermined distance from the transverse part along the longitudinal direction toward the second vertex of the supporting part, the second predetermined distance is smaller than the first predetermined distance, and the extension wall is connected to the supporting part.

2. The rack system of claim 1, wherein the fastening member is pivoted relative to the side wall, and the fastening member is configured to be held at the locking position in response to an elastic force of an elastic member.

3. The rack system of claim 1, wherein each of the slide rail assemblies comprises a first rail and a second rail movable relative to the first rail, the first rail is mounted to the at least one post of the rack through the at least one bracket, and the second rail is configured to carry the carried object; when the carried object is located at the predetermined position relative to the first rail through the second rail, the second rail is adjacent to a lateral side of the longitudinal part of the fastening member for preventing the fastening member from being moved away from the locking position.

4. The rack system of claim 1, wherein when the fastening member is located at the locking position, the transverse part of the fastening member is adjacent to a surface of the at least one post.

5. The rack system of claim 1, wherein the at least one bracket device further comprises an end wall substantially perpendicularly connected to the side wall, and the mounting member is arranged on the end wall.

6. The rack system of claim 1, wherein when the fastening member is located at the locking position, the supporting part and the extension wall respectively face toward and are adjacent to two lateral sides of the mounting member.

7. A bracket device, comprising:
a side wall;
a mounting member arranged adjacent to the side wall, the mounting member having a first vertex; and
a fastening member movable relative to the side wall and configured to be located at a locking position, the fastening member comprising a supporting part, the supporting part having a second vertex;
wherein the second vertex of the supporting part and the first vertex of the mounting member are configured to be substantially located at a same longitudinal position along a longitudinal direction;
wherein the fastening member further comprises a longitudinal part and a transverse part bent relative to the longitudinal part, the supporting part is extended a first predetermined distance from the transverse part along the longitudinal direction;
wherein the fastening member further comprises an extension wall extended a second predetermined distance from the transverse part along the longitudinal direction toward the second vertex of the supporting part, the second predetermined distance is smaller than the first predetermined distance, and the extension wall is connected to the supporting part.

8. The bracket device of claim 7, wherein the fastening member is pivoted relative to the side wall, and the bracket device further comprises an elastic member for providing an elastic force to the fastening member.

9. The bracket device of claim 8, wherein the fastening member further comprises an operating part for being operated to move the fastening part away from the locking position.

10. The bracket device of claim 7, further comprising an end wall substantially perpendicularly bent relative to the side wall, and the mounting member is arranged on the end wall.

11. The bracket device of claim 7, wherein when the fastening member is located at the locking position, the supporting part and the extension wall respectively face toward and are adjacent to two lateral sides of the mounting member.

* * * * *